US012646686B2

(12) United States Patent (10) Patent No.: US 12,646,686 B2

Oliveti et al. (45) Date of Patent: Jun. 2, 2026

(54) COMPOUND HELICAL INDUCTOR COIL

(71) Applicant: COMET TECHNOLOGIES USA, INC., San Jose, CA (US)

(72) Inventors: Anthony Oliveti, San Jose, CA (US); John Nelson, San Jose, CA (US); J. Kirkwood Rough, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 193 days.

(21) Appl. No.: 18/362,633

(22) Filed: Jul. 31, 2023

(65) Prior Publication Data

US 2024/0038497 A1 Feb. 1, 2024

Related U.S. Application Data

(60) Provisional application No. 63/393,329, filed on Jul. 29, 2022.

(51) Int. Cl.
H01J 37/32 (2006.01)
H01F 37/00 (2006.01)

(52) U.S. Cl.
CPC ........ H01J 37/32183 (2013.01); H01F 37/00 (2013.01)

(58) Field of Classification Search
CPC ............................ H01J 37/32183; H01F 37/00
See application file for complete search history.

(56) References Cited

U.S. PATENT DOCUMENTS

| | | | |
|---|---|---|---|
| 4,679,007 A | 7/1987 | Reese et al. | |
| 5,195,045 A | 3/1993 | Keane et al. | |

| | | | |
|---|---|---|---|
| 5,394,061 A | 2/1995 | Fujii | |
| 5,576,629 A | 11/1996 | Turner et al. | |
| 5,609,737 A | 3/1997 | Fukui et al. | |
| 5,629,653 A | 5/1997 | Stimson | |
| 5,737,175 A | 4/1998 | Grosshart et al. | |
| 5,792,261 A | 8/1998 | Hama et al. | |
| 5,810,963 A | 9/1998 | Tomioka | |
| 5,842,154 A | 11/1998 | Harnett et al. | |

(Continued)

FOREIGN PATENT DOCUMENTS

| | | | | | |
|---|---|---|---|---|---|
| EP | 0902442 A1 * | 3/1999 | ......... | H01F 27/2847 |
| JP | 04239211 A | 8/1992 | | |

(Continued)

OTHER PUBLICATIONS

PCT/US2018/062951—International Search Report and Written Opinion of International Searching Authority, dated Aug. 28, 2019, 10 pages.

(Continued)

*Primary Examiner* — Henry Luong

(74) *Attorney, Agent, or Firm* — Nolte Lackenbach Siegel; N. Alexander Nolte

(57) ABSTRACT

A high frequency, high voltage compound helical inductor coil includes a primary coil configured as a helix, a secondary coil configured as a helix and being surrounded by and parallel with the primary coil. A dielectric insulator, configured as a helix, is disposed between and separates the primary coil and the secondary coil. A center conductor may extend axially through the primary and secondary coils and may be attached at a first end to the primary coil and at a second end to the secondary coil.

19 Claims, 12 Drawing Sheets

(56) References Cited

U.S. PATENT DOCUMENTS

| | | | |
|---|---|---|---|
| 5,849,136 A | 12/1998 | Mintz et al. |
| 5,866,869 A | 2/1999 | Schneider |
| 5,889,252 A | 3/1999 | Williams et al. |
| 5,910,886 A | 6/1999 | Coleman |
| 5,914,974 A | 6/1999 | Partlo |
| 6,016,131 A | 1/2000 | Sato et al. |
| 6,157,179 A | 12/2000 | Miermans |
| 6,164,241 A | 12/2000 | Chen et al. |
| 6,252,354 B1 | 6/2001 | Collins et al. |
| 6,313,584 B1 | 11/2001 | Johnson et al. |
| 6,313,587 B1 | 11/2001 | MacLennan et al. |
| 6,326,597 B1 | 12/2001 | Lubomirsky et al. |
| 6,407,648 B1 | 6/2002 | Johnson |
| 6,455,437 B1 | 9/2002 | Davidow et al. |
| 6,463,875 B1 | 10/2002 | Chen et al. |
| 6,507,155 B1 | 1/2003 | Barnes et al. |
| 6,652,717 B1 | 11/2003 | Hong |
| 6,677,828 B1 | 1/2004 | Harnett et al. |
| 6,694,915 B1 * | 2/2004 | Holland ................ H01J 37/321 |
| | | 118/723 R |
| 6,703,080 B2 | 3/2004 | Reyzelman |
| 6,806,437 B2 | 10/2004 | Oh |
| 6,876,155 B2 | 4/2005 | Howald et al. |
| 6,894,245 B2 | 5/2005 | Hoffman |
| 6,949,887 B2 | 9/2005 | Kirkpatrick et al. |
| 7,030,335 B2 | 4/2006 | Hoffman |
| 7,042,311 B1 | 5/2006 | Hilliker et al. |
| 7,079,597 B1 | 7/2006 | Kenwood |
| 7,102,292 B2 | 9/2006 | Parsons et al. |
| 7,192,505 B2 | 3/2007 | Roche et al. |
| 7,196,283 B2 | 3/2007 | Buchberger, Jr. |
| 7,215,697 B2 | 5/2007 | Hill et al. |
| 7,220,937 B2 | 5/2007 | Hoffman |
| 7,251,121 B2 | 7/2007 | Bhutta |
| 7,259,623 B2 | 8/2007 | Coleman |
| 7,298,128 B2 | 11/2007 | Bhutta |
| 7,467,612 B2 | 12/2008 | Suckewer |
| 7,514,936 B2 | 4/2009 | Anwar |
| 7,795,877 B2 | 9/2010 | Radtke |
| 7,796,368 B2 | 9/2010 | Kotani |
| 8,169,162 B2 | 5/2012 | Yuzurihara |
| 8,203,372 B2 | 6/2012 | Arduini |
| 8,222,822 B2 | 7/2012 | Gilbert |
| 8,421,377 B2 | 4/2013 | Kirchmeier |
| 8,466,622 B2 | 6/2013 | Knaus |
| 8,471,746 B2 | 6/2013 | Kurunezi et al. |
| 8,491,759 B2 | 7/2013 | Pipitone et al. |
| 8,742,669 B2 | 6/2014 | Carter et al. |
| 8,779,662 B2 | 7/2014 | Boston |
| 8,803,424 B2 | 8/2014 | Boston |
| 8,884,180 B2 | 11/2014 | Ilie |
| 8,896,391 B2 | 11/2014 | du Toit |
| 8,928,229 B2 | 1/2015 | Boston |
| 9,042,121 B2 | 5/2015 | Walde et al. |
| 9,065,426 B2 | 6/2015 | Mason et al. |
| 9,105,447 B2 | 8/2015 | Brouk et al. |
| 9,111,725 B2 | 8/2015 | Boston |
| 9,124,248 B2 | 9/2015 | Van Zyl et al. |
| 9,142,388 B2 | 9/2015 | Hoffman et al. |
| 9,148,086 B2 | 9/2015 | Fife et al. |
| 9,166,481 B1 | 10/2015 | Vinciarelli |
| 9,171,700 B2 | 10/2015 | Gilmore |
| 9,196,459 B2 | 11/2015 | Bhutta |
| 9,208,992 B2 | 12/2015 | Brouk et al. |
| 9,224,579 B2 | 12/2015 | Finley et al. |
| 9,225,299 B2 | 12/2015 | Mueller et al. |
| 9,287,098 B2 | 3/2016 | Finley et al. |
| 9,294,100 B2 | 3/2016 | Van Zyl et al. |
| 9,306,533 B1 | 4/2016 | Mavretic |
| 9,313,870 B2 | 4/2016 | Walde et al. |
| 9,337,804 B2 | 5/2016 | Mason et al. |
| 9,345,122 B2 | 5/2016 | Bhutta |
| 9,385,021 B2 | 7/2016 | Chen |
| 9,418,822 B2 | 8/2016 | Kaneko |
| 9,478,397 B2 | 10/2016 | Blackburn et al. |

| | | | |
|---|---|---|---|
| 9,483,066 B2 | 11/2016 | Finley et al. |
| 9,490,353 B2 | 11/2016 | Van Zyl et al. |
| 9,496,122 B1 | 11/2016 | Bhutta |
| 9,520,269 B2 | 12/2016 | Finley et al. |
| 9,524,854 B2 | 12/2016 | Hoffman et al. |
| 9,525,412 B2 | 12/2016 | Mavretic |
| 9,536,713 B2 | 1/2017 | Van Zyl et al. |
| 9,543,122 B2 | 1/2017 | Bhutta |
| 9,544,987 B2 | 1/2017 | Mueller et al. |
| 9,558,917 B2 | 1/2017 | Finley et al. |
| 9,577,516 B1 | 2/2017 | Van Zyl et al. |
| 9,578,731 B2 | 2/2017 | Van Zyl |
| 9,584,090 B2 | 2/2017 | Mavretic |
| 9,589,767 B2 | 3/2017 | Hoffman et al. |
| 9,591,739 B2 | 3/2017 | Bhutta |
| 9,620,340 B2 | 4/2017 | Finley et al. |
| 9,651,957 B1 | 5/2017 | Finley et al. |
| 9,660,613 B2 | 5/2017 | Van Zyl et al. |
| 9,673,028 B2 | 6/2017 | Walde et al. |
| 9,697,911 B2 | 7/2017 | Bhutta |
| 9,711,331 B2 | 7/2017 | Mueller et al. |
| 9,711,335 B2 | 7/2017 | Christie et al. |
| 9,728,378 B2 | 8/2017 | Bhutta et al. |
| 9,729,122 B2 | 8/2017 | Mavretic |
| 9,741,544 B2 | 8/2017 | Van Zyl et al. |
| 9,745,660 B2 | 8/2017 | Bhutta |
| 9,748,076 B1 | 8/2017 | Choi et al. |
| 9,755,641 B1 | 9/2017 | Bhutta |
| 9,773,644 B2 | 9/2017 | Van Zyl et al. |
| 9,807,863 B1 | 10/2017 | Van Zyl et al. |
| 9,812,305 B2 | 11/2017 | Pelleymounter et al. |
| 9,844,127 B2 | 12/2017 | Bhutta |
| 9,852,890 B2 | 12/2017 | Mueller et al. |
| 9,854,659 B2 | 12/2017 | Van Zyl et al. |
| 9,865,432 B1 | 1/2018 | Bhutta |
| 9,952,297 B2 | 4/2018 | Wang |
| 10,008,317 B2 | 6/2018 | Iyer |
| 10,020,752 B1 | 7/2018 | Vinciarelli |
| 10,026,592 B2 | 7/2018 | Chen |
| 10,026,594 B2 | 7/2018 | Bhutta |
| 10,026,595 B2 | 7/2018 | Choi et al. |
| 10,074,518 B2 | 9/2018 | Van Zyl et al. |
| 10,139,285 B2 | 11/2018 | Murray et al. |
| 10,141,788 B2 | 11/2018 | Kamstedt |
| 10,194,518 B2 | 1/2019 | Van Zyl et al. |
| 10,217,618 B2 | 2/2019 | Larson et al. |
| 10,224,184 B2 | 3/2019 | Van Zyl et al. |
| 10,224,186 B2 | 3/2019 | Polak et al. |
| 10,263,577 B2 | 4/2019 | Van Zyl et al. |
| 10,269,540 B1 | 4/2019 | Carter et al. |
| 10,314,156 B2 | 6/2019 | Van Zyl et al. |
| 10,332,730 B2 | 6/2019 | Christie et al. |
| 10,340,879 B2 | 7/2019 | Mavretic |
| 10,373,811 B2 | 8/2019 | Christie et al. |
| 10,374,070 B2 | 8/2019 | Wood |
| 10,410,836 B2 | 9/2019 | McChesney |
| 10,411,769 B2 | 9/2019 | Bae |
| 10,447,174 B1 | 10/2019 | Porter, Jr. et al. |
| 10,469,108 B2 | 11/2019 | Howald |
| 10,475,622 B2 | 11/2019 | Pankratz et al. |
| 10,910,197 B2 | 2/2021 | Coumou |
| 11,120,971 B2 | 9/2021 | Huang et al. |
| 2003/0076092 A1 | 4/2003 | Hoshino |
| 2003/0230984 A1 | 12/2003 | Kitamura et al. |
| 2004/0026235 A1 | 2/2004 | Stowell, Jr. |
| 2005/0034811 A1 | 2/2005 | Mahoney et al. |
| 2005/0045475 A1 | 3/2005 | Wantanabe |
| 2005/0270805 A1 | 12/2005 | Yasumura |
| 2006/0005928 A1 | 1/2006 | Howald |
| 2006/0169582 A1 | 8/2006 | Brown et al. |
| 2006/0169584 A1 | 8/2006 | Brown et al. |
| 2006/0249729 A1 | 11/2006 | Mundt et al. |
| 2007/0121267 A1 | 5/2007 | Kotani |
| 2007/0222428 A1 | 9/2007 | Garvin et al. |
| 2008/0061901 A1 | 3/2008 | Gilmore |
| 2008/0087381 A1 | 4/2008 | Shannon et al. |
| 2008/0197854 A1 | 8/2008 | Valcore et al. |
| 2008/0272875 A1 | 11/2008 | Huang et al. |
| 2008/0317974 A1 | 12/2008 | de Vries |

(56) References Cited

U.S. PATENT DOCUMENTS

| | | | |
|---|---|---|---|
| 2009/0026964 A1 | 1/2009 | Knaus | |
| 2009/0206974 A1 | 8/2009 | Meinke | |
| 2009/0234619 A1 | 9/2009 | Iwanami et al. | |
| 2010/0012029 A1 | 1/2010 | Forester et al. | |
| 2010/0072172 A1 | 3/2010 | Ui et al. | |
| 2010/0096261 A1 | 4/2010 | Hoffman et al. | |
| 2010/0098882 A1 | 4/2010 | Lubomirsky et al. | |
| 2010/0159120 A1 | 6/2010 | Dzengeleski et al. | |
| 2011/0115379 A1 | 5/2011 | Long et al. | |
| 2011/0121735 A1 | 5/2011 | Penny | |
| 2011/0125429 A1 | 5/2011 | Kazama et al. | |
| 2011/0140607 A1 | 6/2011 | Moore et al. | |
| 2011/0148303 A1 | 6/2011 | Van Zyl et al. | |
| 2011/0174777 A1 | 7/2011 | Jensen et al. | |
| 2012/0097104 A1 | 4/2012 | Pipitone et al. | |
| 2012/0097524 A1 | 4/2012 | Pipitone et al. | |
| 2012/0145322 A1 | 6/2012 | Gushiken et al. | |
| 2012/0164834 A1 | 6/2012 | Jennings et al. | |
| 2012/0262064 A1 | 10/2012 | Nagarkatti | |
| 2013/0140984 A1 | 6/2013 | Hirayama | |
| 2013/0214683 A1 | 8/2013 | Valcore et al. | |
| 2013/0240482 A1 | 9/2013 | Nam et al. | |
| 2014/0225504 A1 | 8/2014 | Kaneko | |
| 2014/0239813 A1 | 8/2014 | Van Zyl | |
| 2014/0265911 A1 | 9/2014 | Karnata et al. | |
| 2014/0328027 A1 | 11/2014 | Zhang et al. | |
| 2014/0349593 A1 | 11/2014 | Danak et al. | |
| 2014/0367043 A1 | 12/2014 | Bishara et al. | |
| 2015/0002020 A1 | 1/2015 | Boston | |
| 2015/0115797 A1 | 4/2015 | Yuzurihara | |
| 2015/0150710 A1 | 6/2015 | Evans et al. | |
| 2015/0313000 A1 | 10/2015 | Thomas et al. | |
| 2015/0349750 A1 | 12/2015 | Van Zyl et al. | |
| 2016/0002020 A1 | 1/2016 | Orita | |
| 2016/0308560 A1 | 10/2016 | Howald et al. | |
| 2017/0018349 A1 | 1/2017 | Otsubo et al. | |
| 2017/0125218 A1 | 5/2017 | Sato | |
| 2017/0133886 A1 | 5/2017 | Kurs et al. | |
| 2017/0307776 A1 | 10/2017 | Pan et al. | |
| 2017/0330729 A1 | 11/2017 | Mavretic | |
| 2017/0338081 A1 | 11/2017 | Yamazawa | |
| 2017/0345620 A1 | 11/2017 | Coumou et al. | |
| 2018/0034446 A1 | 2/2018 | Wood | |
| 2018/0102238 A1 | 4/2018 | Gu et al. | |
| 2018/0358205 A1 | 12/2018 | Long | |
| 2019/0172683 A1 | 6/2019 | Mavretic | |
| 2019/0199241 A1 | 6/2019 | Satoshi et al. | |
| 2019/0229603 A1 | 7/2019 | Dubois et al. | |
| 2019/0385822 A1 | 12/2019 | Marakhtanov et al. | |
| 2020/0083022 A1 | 3/2020 | Huang et al. | |
| 2020/0212868 A1 | 7/2020 | Morii | |
| 2021/0013009 A1 | 1/2021 | Oliveti et al. | |
| 2022/0189740 A1 | 6/2022 | Oliveti et al. | |
| 2022/0359118 A1* | 11/2022 | Guo | H01F 41/04 |

FOREIGN PATENT DOCUMENTS

| | | | |
|---|---|---|---|
| JP | 05284046 A | 8/1993 | |
| JP | 2006-310245 A1 | 6/2008 | |
| JP | 2015-502213 A1 | 1/2015 | |
| KR | 10-2006-0067957 A | 6/2006 | |
| KR | 10-2017-0127724 A | 11/2017 | |
| KR | 10-2018-0038596 A | 4/2018 | |
| WO | 2012054305 | 4/2012 | |
| WO | 2012054306 | 4/2012 | |
| WO | 2012054307 | 4/2012 | |
| WO | 2016097730 | 6/2016 | |
| WO | 2019147513 A1 | 8/2019 | |
| WO | 2019-244734 A1 | 12/2019 | |
| WO | 2020-112108 A1 | 6/2020 | |

OTHER PUBLICATIONS

Stowell, et al., "RF-superimposed DC and pulsed DC sputtering for deposition of transparent conductive oxides", Thin Solid Films 515 (2007), pp. 7654-7657.

Bender, et al., "Characterization of a RF=dc-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 18-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

PCT/US2020/038892—International Search Report and Written Opinion of the International Searching Authority, dated Oct. 6, 2020, 3 pages.

PCT/US2020/038899—International Search Report and Written Opinion of the International Searching Authority, dated Sep. 26, 2019, 5 pages.

PCT/US2021/012847—International Search Report and Written Opinion of the International Searching Authority, dated May 6, 2021, 11 pages.

PCT/US2021/012849 International Search Report and Written Opinion of the International Searching Authority, dated May 10, 2021, 11 pages.

PCT/US2021/012851 International Search Report and Written Opinion of the International Searching Authority, dated May 6, 2021, 10 pages.

PCT/US2022/016803—International Search Report and Written Opinion of International Searching Authority, dated Jun. 9, 2022, 9 pages.

PCT/US2021/052172—International Search Report and Written Opinion of International Searching Authority, dated Jan. 11, 2022, 6 pages.

* cited by examiner

300
COMPOUND HELICAL
INDUCTOR COIL
(NON-UNITY TURNS RATIO)

320

INPUT
304

302

306

304

OUTPUT

COMPOUND HELICAL INDUCTOR COIL

REFERENCE TO RELATED APPLICATION

This application claims filing priority to U.S. Provisional Application Ser. No. 63/393,329 filed Jul. 29, 2022, which is incorporated by reference.

BACKGROUND

Electrical inductors, also sometimes referred to as reactors, are used in a variety of applications, such as plasma processing involving high power radio frequency signals used to fabricate wafers used to create integrated circuits. Inductors may be utilized, for example, in conjunction with or as part of plasma processing impedance matching networks in which signal loss, breakdown voltage, and inter-electrode capacitance issues may arise.

SUMMARY

A compound helical inductor coil is disclosed. The compound helical inductor may also be used in a T-coil assembly, or a plasma processing system utilizing the compound helical inductor coil. The compound helical inductor coil includes a primary coil configured as a helix, and a secondary coil configured as a helix parallel with the primary coil. The compound helical inductor coil further includes a dielectric insulator configured as a helix disposed between and separating the primary coil and the secondary coil.

In a representative embodiment, the primary coil has an elongate cut-out through which an outer protrusion of the dielectric insulator extends. Similarly, the secondary coil has an elongate cut-out therein, through which an inner protrusion of the dielectric insulator extends. A center conductor extends axially through the primary and secondary coils, with the center conductor coupled at a first end to the primary coil and coupled at a second end to the secondary coil. The primary and secondary coils are made of copper, while the dielectric insulator may be made of polytetrafluoroethylene (PTFE). The primary coil and secondary coil may define a unity or a non-unity turns ratio.

It will be understood that specific embodiments may include a variety of features and options in different combinations, as may be desired by different users. Practicing the invention does not require utilization of all, or any particular combination, of these specific features or options. The specific techniques and structures for implementing particular embodiments of the invention and accomplishing the associated advantages will become apparent from the following detailed description of the embodiments and the appended drawings and claims.

The above presents a simplified summary in order to provide a basic understanding of some aspects of the invention. This summary is not an exhaustive overview of the invention. It is not intended to identify key or critical elements of the disclosure or to delineate the scope of the invention. Its sole purpose is to present some concepts in a simplified form as a prelude to the following more detailed description, appended drawings, and claims.

BRIEF DESCRIPTION OF THE DRAWINGS

The present disclosure is best understood from the following detailed description when read with the accompanying figures.

Figure 1:
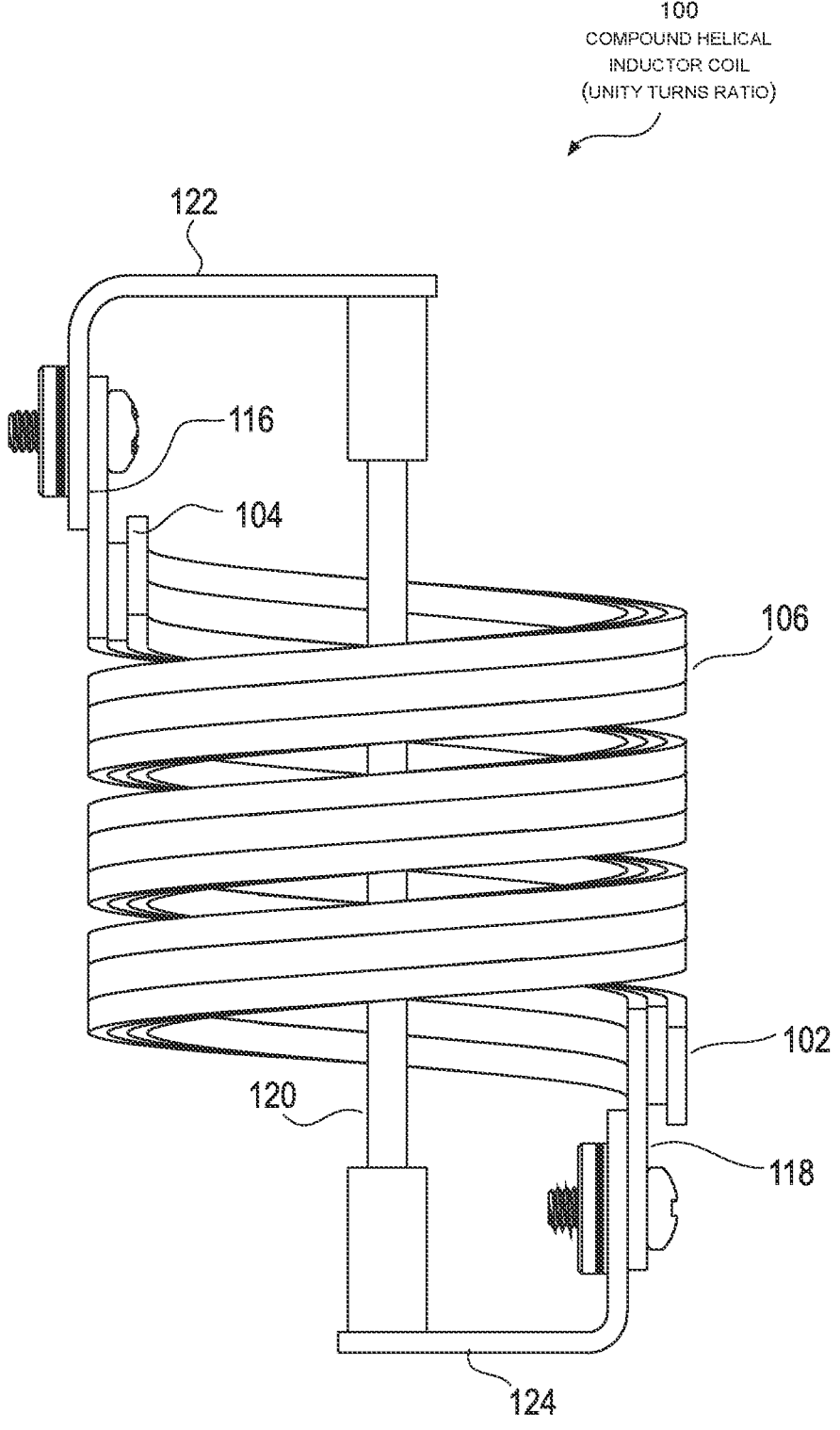
FIG. 1 is a side view of a compound helical inductor coil with a unity turns ratio.

It is emphasized that, in accordance with the standard practice in the industry, various features are not drawn to scale. In fact, the dimensions of the various features may be arbitrarily increased or reduced for clarity of discussion or illustration.

DETAILED DESCRIPTION

Illustrative examples of the subject matter claimed below are disclosed. In the interest of clarity, not all features of an actual implementation are described for every example in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

The expressions such as "include" and "may include" which may be used in the present disclosure denote the presence of the disclosed functions, operations, and constituent elements, and do not limit the presence of one or more additional functions, operations, and constituent elements. In the present disclosure, terms such as "include" and/or "have", may be construed to denote a certain characteristic, number, operation, constituent element, component or a combination thereof, but should not be construed to exclude the existence of or a possibility of the addition of one or more other characteristics, numbers, operations, constituent elements, components or combinations thereof.

As used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

As used herein, to "provide" an item means to have possession of and/or control over the item. This may include, for example, forming (or assembling) some or all of the item from its constituent materials and/or, obtaining possession of and/or control over an already-formed item.

Unless otherwise defined, all terms including technical and/or scientific terms used herein have the same meaning as commonly understood by one of ordinary skill in the art to which the present disclosure pertains. In addition, unless otherwise defined, all terms defined in generally used dictionaries may not be overly interpreted.

In examples herein, compound helical inductor coils are described having primary and secondary conductors formed of rectangular copper bar stock. The primary and secondary conductors may be arranged such that the primary coil creates the foundation of the compound helical inductor coil. The dielectric may be laid on top of the primary coil, and the secondary coil may be laid on top of the dielectric. Other types of or shapes of stock materials may be used to form a compound helical inductor coil without departing from the concepts of this disclosure.

The components of a compound helical inductor coil in some examples may be wound into a helix, resembling a conventional helical inductor. A cylindrical rod may be passed through the center of the helix to connect the output of the primary conductor to the secondary conductor. This may allow the compound helical inductor coils to operate as a T-coil, an autotransformer, or a L-reactor.

In some examples, the compound helical inductor coil conductors may have a middle portion cut out to allow a dielectric to protrude through from the center. This may decrease coupling capacitance between the primary and secondary conductors.

In some examples, the entire compound helical inductor coil assembly may be left bare, or may be coated. In examples, the compound helical inductor coil and/or its components may be coated with a thin polyimide coating applied by plasma vapor deposition (PVD) or other means.

In examples, the construction technique with layered conductors and dielectric that each have a helical geometry may allow for a relatively high (i.e., greater than 0.8) coupling coefficient without the use of a permeable material. Further, the construction may allow for efficient cooling, high voltage stand-off, and high current handling. These characteristics render the compound helical inductor coils suitable for high-frequency, high-power matching and transforming applications where traditional compound helical inductor coil implementations may be too lossy, have too low of a breakdown voltage, or have excessive inter-electrode capacitance.

Figure 2:
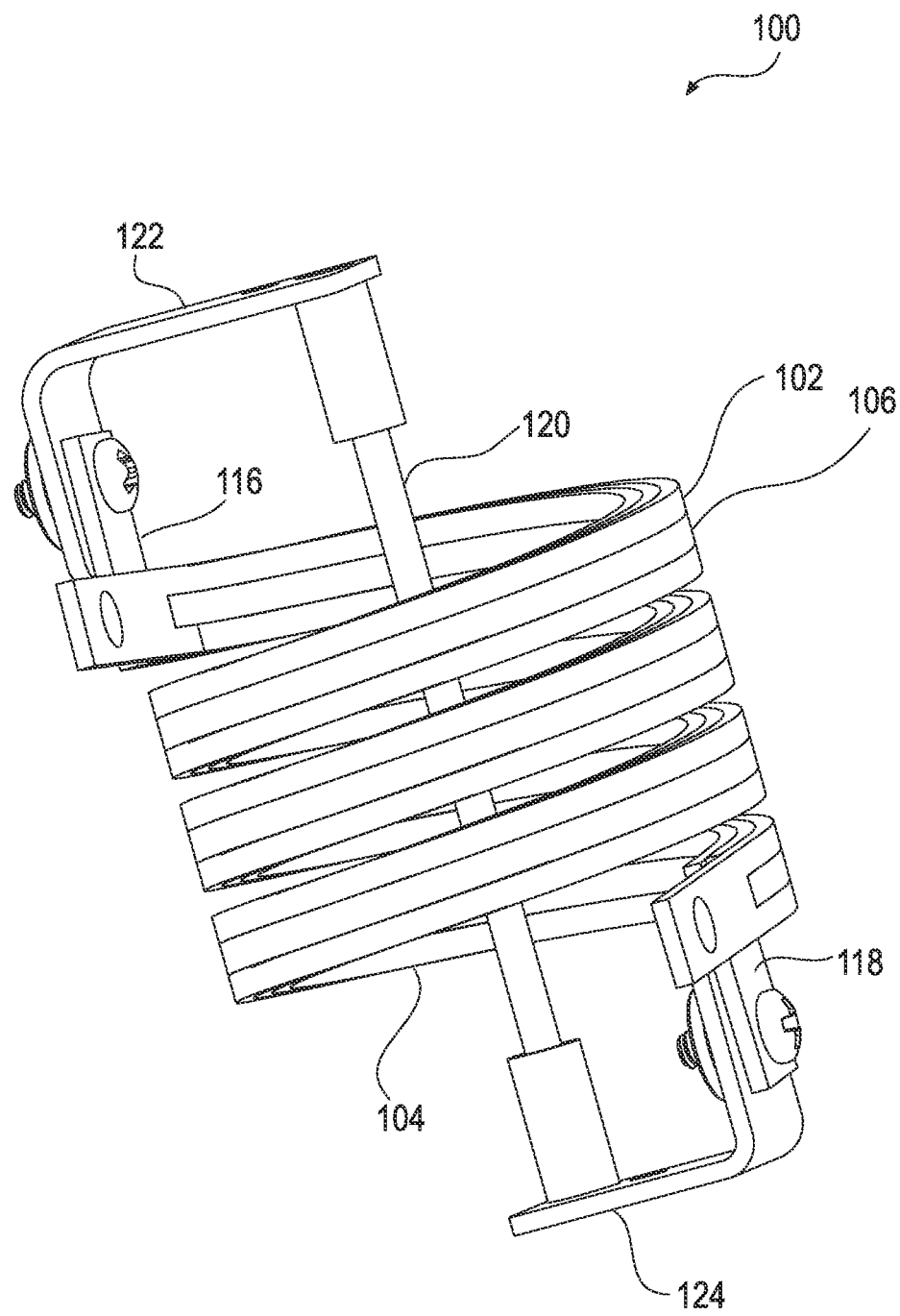
FIG. 2 is an isometric view of the compound helical inductor coil.
Figure 3:
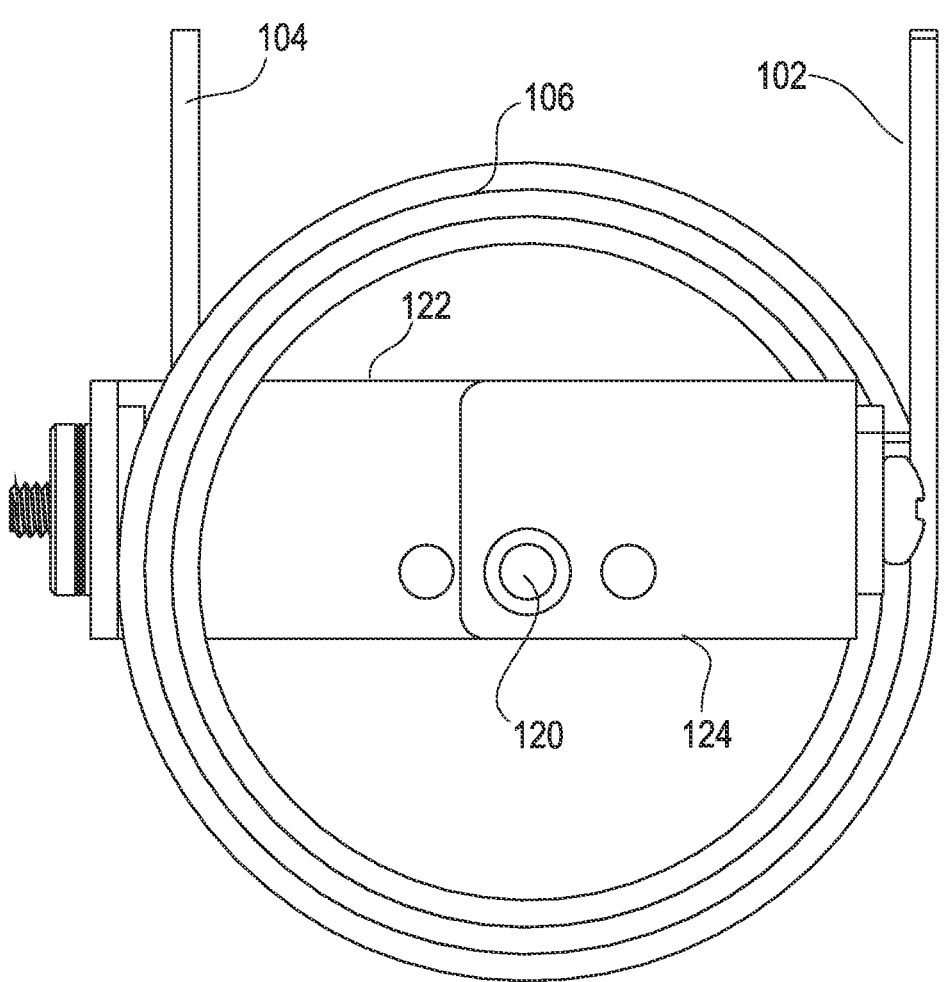
FIG. 3 is an end view of the compound helical inductor coil.

FIG. 1 is a side view of a compound helical inductor coil 100 according to one or more examples. FIG. 2 is an isometric view of compound helical inductor coil 100, and FIG. 3 is an end view of compound helical inductor coil 100.

Figure 4:
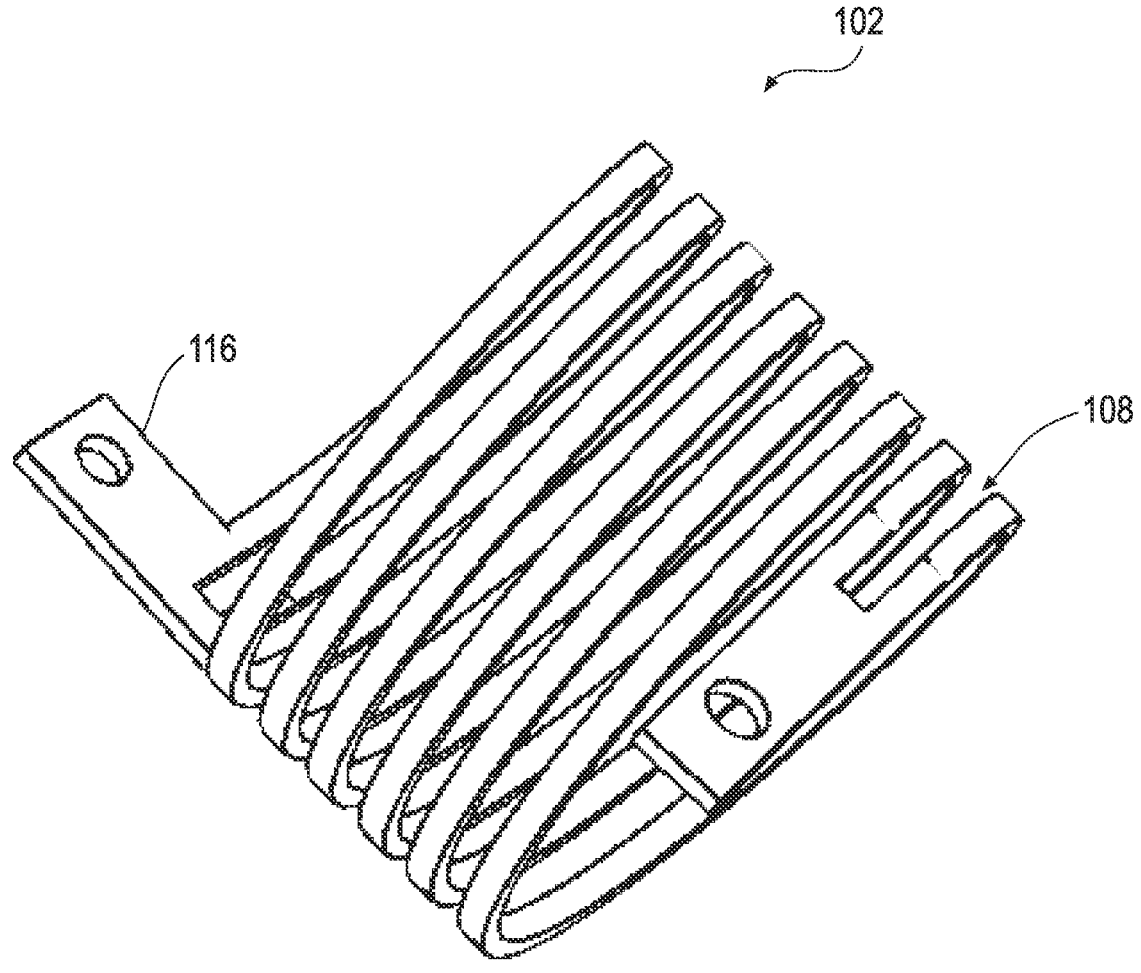
FIG. 4 is an isometric view of a primary coil of the compound helical inductor coil.
Figure 5:
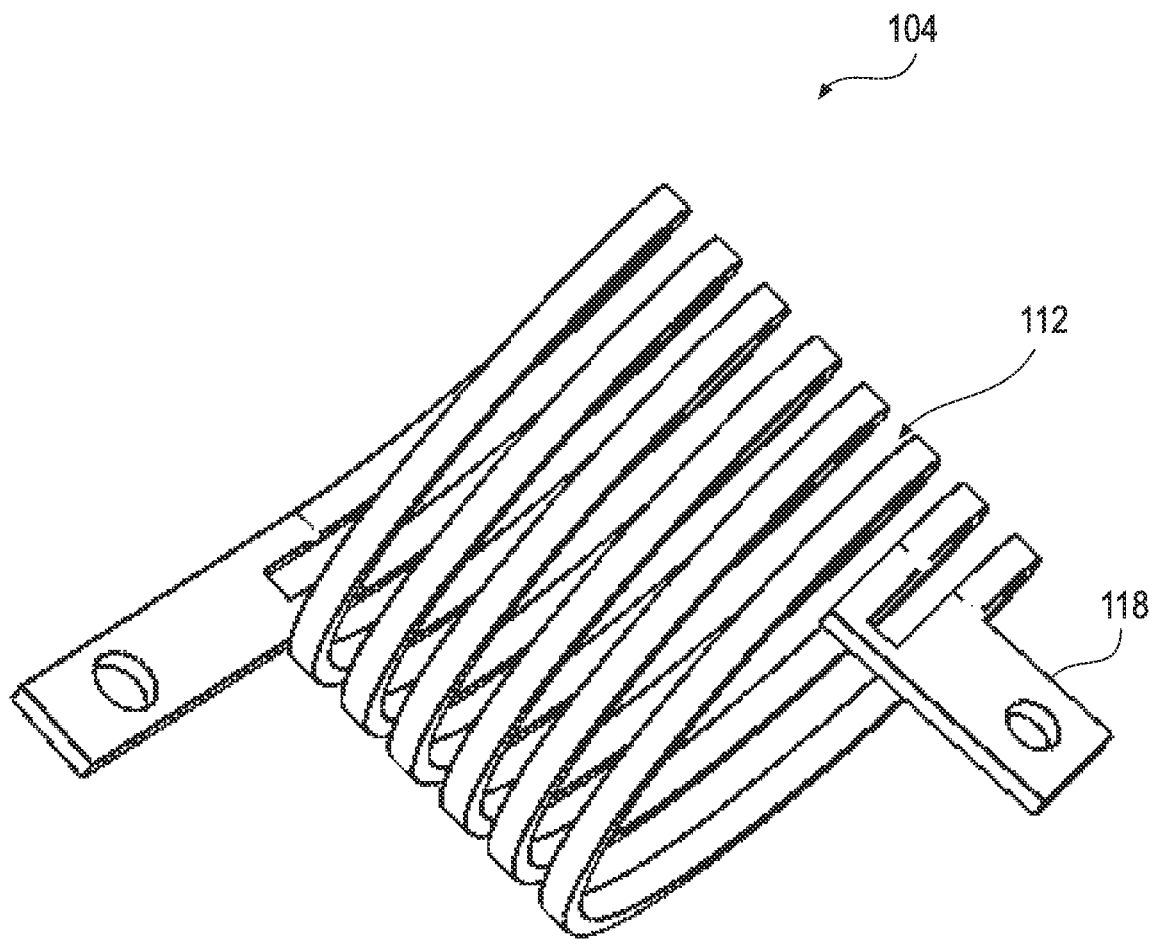
FIG. 5 is an isometric view of a secondary coil of the compound helical inductor coil.

Compound helical inductor coil 100 (hereinafter, "compound helical inductor coil 100") includes an outer conductor 102 and an inner conductor 104. FIG. 4 is an isometric view of outer conductor 102, and FIG. 5 is an isometric view of inner conductor 104. In examples, inner and outer conductors 104 and 102 may consist of rectangular copper stock wound into a helical geometry, with outer conductor 102 surrounding and parallel with inner conductor 104.

Figure 6:
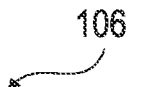
FIG. 6 is an isometric view of an insulator between the primary and secondary coils of the compound helical inductor coil.
Figure 6:
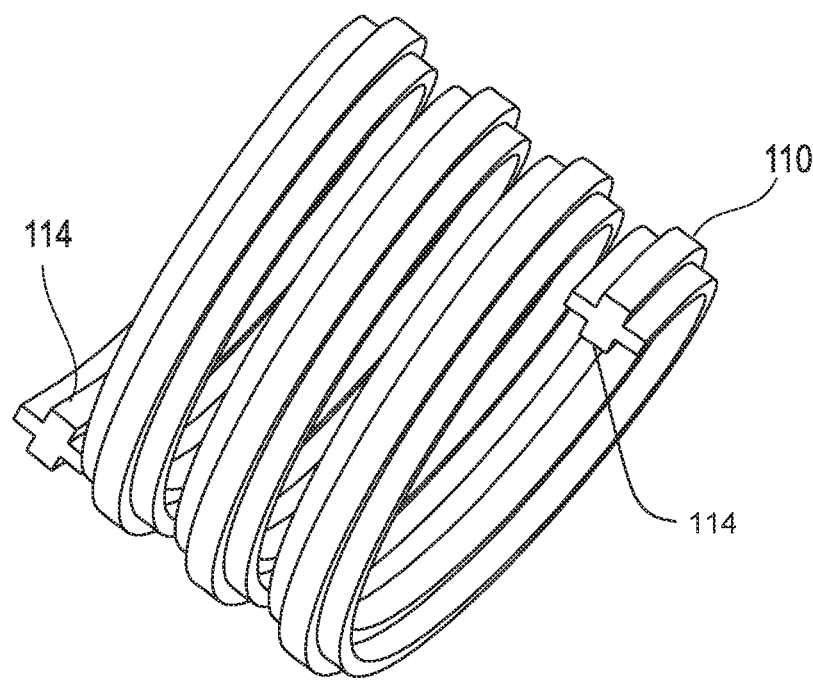

Compound helical inductor coil 100 may further consist of a helical dielectric insulator 106 interposed between outer conductor 102 and inner conductor 104. The dielectric insulator 106 is configured as a helix. FIG. 6 is an isometric view of dielectric insulator 106 according to one or more examples. In examples, dielectric insulator may be made of PTFE (polytetrafluoroethylene) or other suitable dielectric insulating materials.

In examples, inner conductor 104 forms the foundation of compound helical inductor coil 100, dielectric structure 106 is placed on top of inner conductor 104, and then outer conductor 102 is placed on top of the dielectric insulator 106. This assembly is then wound into a helical geometry.

In some examples, such as shown in FIGS. 1-6, outer conductor 102 has an elongated cut-out 108 (shown in FIG. 4) through which an outer protrusion 110 of dielectric insulator 106 extends. Similarly, inner conductor 104 has an elongated cut-out 112 (shown in FIG. 5) through which an inner protrusion 114 of dielectric insulator 106 extends.

In examples, outer conductor 102 may have a mounting tab 116 formed at one end of compound helical inductor coil 100. Inner conductor 104 may have a mounting tab 118 formed at an opposite end of compound helical inductor coil 100.

Figure 7:
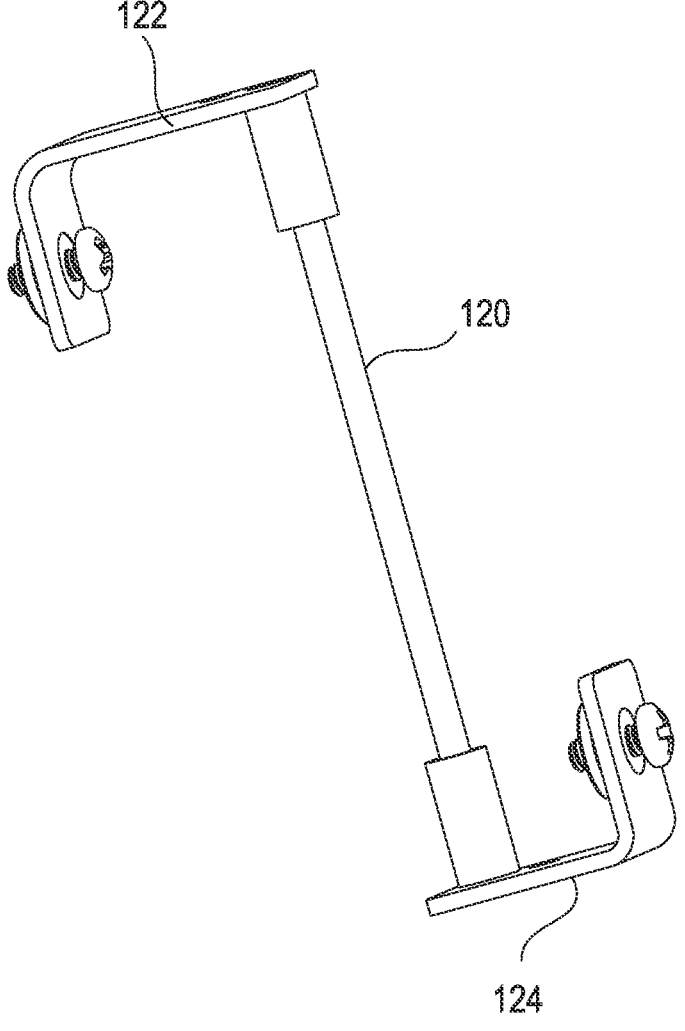
FIG. 7 is an isometric view of a center conductor of the compound helical inductor coil.

In some examples, a center conductor 120 may be provided extending axially through the center of the compound helical inductor coil 100 to connect the output of the primary conductor (e.g., outer conductor 102) to the input of the secondary conductor (e.g., conductor 104). FIG. 7 is an isometric view showing center conductor 120. When provided, center conductor 120 may allow compound helical inductor coil 100 to operate as a "T-coil", an autotransformer, or as an L-reactor.

In examples in which center conductor 120 is used, a first L-bracket 122 may be provided for connection of a first end of center conductor 120 to mounting tab 116 of outer conductor 102, and a second L-bracket 124 may be provided for connection of a second end of center conductor 120 to mounting tab 118 of inner conductor 104.

The components of compound helical inductor coil 100 may be left bare, or coated. In examples, the components of transformer 100 may be coated with a polyimide material that may be applied, for example, by plasma vapor deposition (PVD) or other means. Other coating materials may also be suitable for particular applications.

As noted above, the construction and configuration of compound helical inductor coil 100, including layered conductors and dielectric and helical geometry may allow for a relatively high (i.e., greater than 0.8) coupling coefficient without the use of a permeable material. Further, the construction and geometry of compound helical inductor coil 100 may allow for efficient cooling, high voltage stand-off, and high current handling. These characteristics render the compound helical inductor coils suitable for high-frequency, high-power matching and transforming applications where traditional inductor implementations may be too lossy, have too low of a breakdown voltage, or have excessive inter-electrode capacitance.

Referring to FIGS. 1-7, a specific embodiment of the compound helical inductor coil may be shown approximately to scale designed to operate at nominal frequency of 300 kHz to 300 MHz, power of 100 W to 100 kW, voltage of 10V to 10 kV, and amperage of 1 A to 1000 A, producing an inductance of 100 nH to 100 uH. The overall height of the compound helical inductor coil 100 may be 20 mm to 200 mm. The lengths of the inner (secondary) and (primary) outer coils 104 and 102 may be 20 mm to 200 mm is a double-filament configuration in which each filament has a rounded rectangular cross-sectional shape with dimensions approximately 1 mm by 6.35 mm. The inner (secondary) and outer (primary) coils 104 and 102 may be fabricated from copper, while the dielectric insulator 106 may be fabricated from PTFE with a dielectric constant of approximately 2.1. The center conductor 120 may have dimensions 20 mm to 200 mm length and approximately 3 mm to 10 mm in diameter and be fabricated from copper. The brackets 122, 124 may have dimensions 3 mm to 10 mm and be fabricated from copper.

Various embodiments of the compound helical inductor coil may be constructed by varying these parameters as a matter of design choice. Generally, the compound helical inductor coil produces the following advantages when used in a plasma processing system, for example in conjunction with or as part of the impedance matching network: In one application, the compound helical inductor coil may be used in conjunction with mechanical or solid-state variable capacitors to form a T-coil network. This T-coil network may replacement more commonly used L, Pi, or T type matching circuits. This T-coil network may replace the solid-state Pi network portion of a hybrid matching network. In this case, the T-coil network has several advantages. The T-coil matching network may have a lower stored energy than the equivalent Pi network. This may increase the overall bandwidth of the matching network and may reduce settling time during tuning. The T-coil circuit may also reduce the voltage stress on the solid-state variable capacitors under equivalent operating conditions when compared to the Pi network. The reduction in voltage stress may be approximately 20% or more. This may allow a hybrid matching network to operate at higher power levels than hybrid matching networks using Pi networks.

Figure 8:
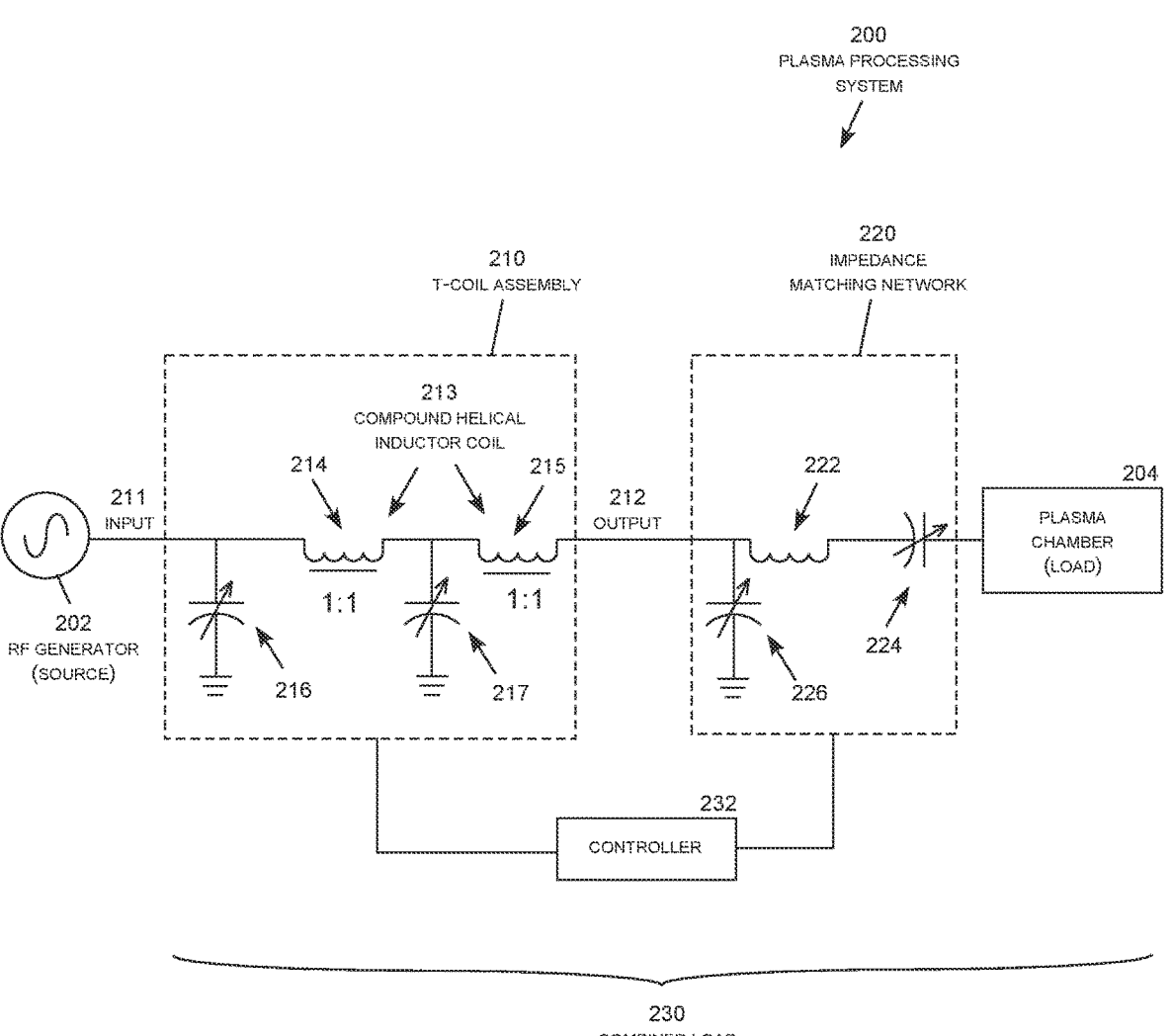
FIG. 8 is a schematic electric diagram of a plasma processing system utilizing a compound helical inductor coil as a T-coil.

To further illustrate with a specific example, FIG. 8 is a schematic electric diagram of a representative plasma processing system 200 including a T-coil assembly 210 that includes an input 211 and an output 212. The input 211 of the T-coil assembly 210 is coupled to an RF generator 202 (source), while the output 212 of the T-coil assembly 210 is coupled to an impedance matching network 220, which, in turn, is coupled to a plasma chamber 204 (load). The T-coil assembly 210 includes a compound helical inductor 213 with a primary coil 214 and a secondary coil 215 connected in series between the input 211 and the output 212. The primary coil 214 and the secondary coil 215 are helically coupled, separated by a dielectric insulator, and connected in series by a center conductor. A representative example of this configuration was described previously with reference to FIGS. 1-7. This particular compound helical inductor coil 213 has a 1:1 turns ratio.

Figure 9:
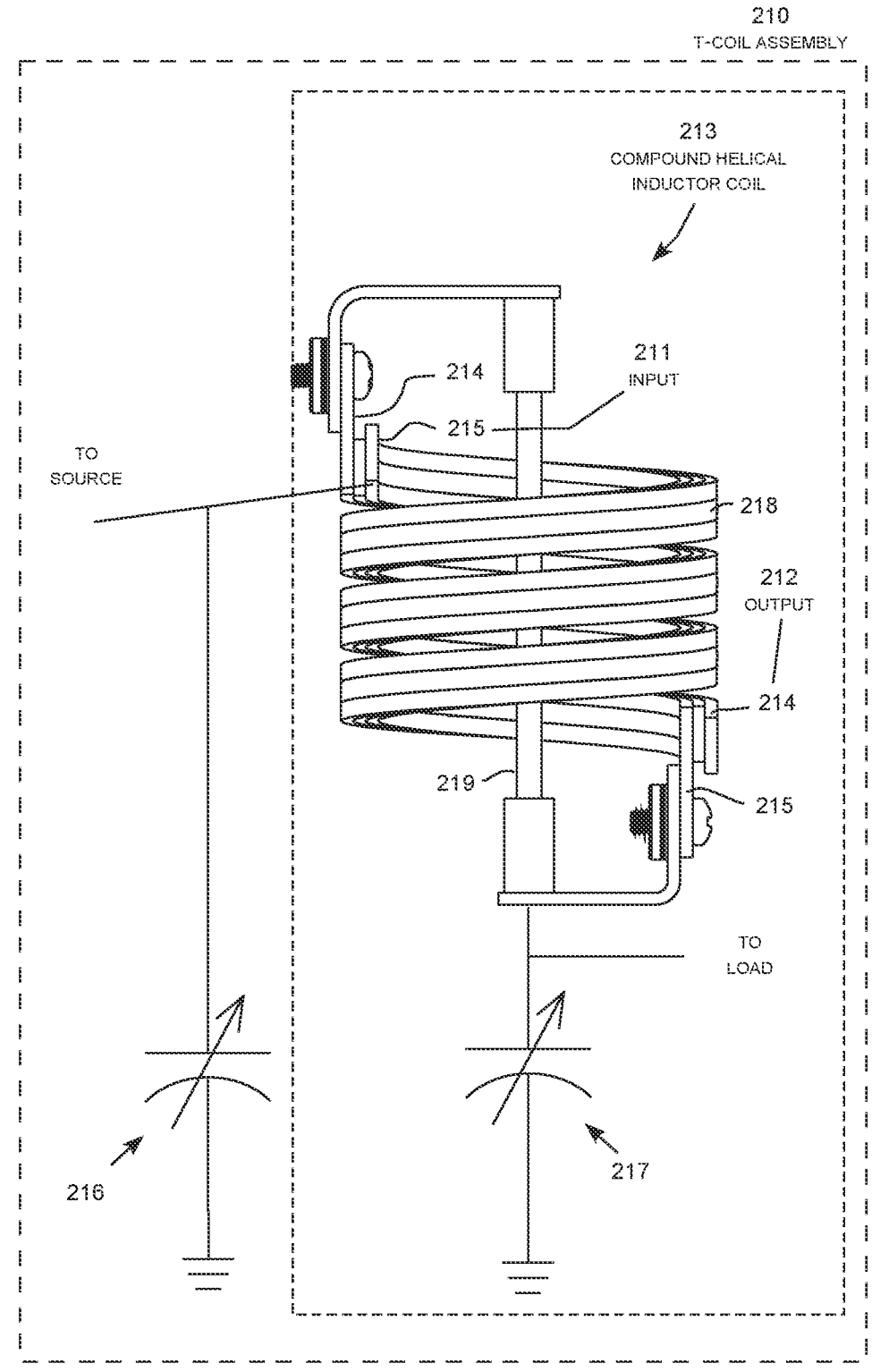
FIG. 9 is a schematic electric diagram of a portion of the plasma processing circuit including the compound helical inductor coil.

The T-coil assembly 210 further includes a first shunt variable capacitor 216 coupling a junction between the input 211 and the primary coil 214 to electric ground. Similarly, the T-coil assembly 210 further includes a second shunt variable capacitor 217 coupling a junction between the primary coil 214 the secondary coil 215 to electric ground. FIG. 9 is a schematic electric diagram of a portion of the plasma processing system 200 including the compound helical inductor coil 213 and the variable capacitors 216 and 217. The variable capacitor 216 coupled to a first (top) end of the inner (secondary) coil 215, which form the input 211 of the compound helical inductor coil 213. The second variable capacitor 217 is coupled the opposing (bottom) end of the inner (secondary) coil 215, while the center conductor 219 connects the bottom end of the inner coil 215 to the top end of the outer (primary) coil 214. The bottom end of the outer (primary) coil 214 forms the output 212 of the compound helical inductor coil 213.

The impedance matching network 220 may include a module 222 coupled in series between the output 212 of the T-coil assembly 210 and the plasma chamber 204, which may be a nominal quarter-wave phase-shift inductor. The impedance matching network 220 further includes a first variable capacitor 224, sometimes referred to as the tuning capacitor. Coupled in series between the module 222 and the plasma chamber 204. In addition, the impedance matching network 220 includes second variable capacitor 226, sometimes referred to as the loading capacitor, coupling a junction between the output 212 of the T-coil assembly 210 and the module 222 to electric ground. In one embodiment, the module 222 may be a phase shift inductor.

In brief summary, the RF generator 202 generates high frequency RF power, for example in the frequency range of 400 KHZ to 400 MHZ, voltage range of 10 to 100 KV, amperage range of 100 A to 10 KA, and power range of 100 KW to 1 MW to drive the plasma chamber 204 to generate plasma streams for a variety of plasma manufacturing operations taking place inside the plasma chamber. In another example, the voltage, amperage, and frequency may be as described above with regard to FIGS. 1-7 in paragraph 42. The RF power may be used, for example, to illuminate one or more concentric coil antennas that ionize a process gas entering the plasma chamber to create a plasma stream directed toward a workpiece, such as masked semiconductor wafer used to manufacture an integrated circuit chip.

The plasma stream may be directed across a filament, screen, or leaf containing a sacrificial metal, such as gold or other desired material, to be deposited onto the wafer. The plasma causes the sacrificial metal to shed ionized atoms or molecules, which are directed by the magnetic field generated by the plasma chamber onto the workpiece. In other plasma processing operations, the plasma may be used to etch, coat, clean, or perform other manufacturing operations on the workpiece. The plasma operations can cause arcing, sputtering, and other rapidly changing plasma phenomena causing the impedance of the plasma chamber to vary sharply in unpredictable and sometimes chaotic manners. The tuning controller continually adjusts the impedance of the matching network in response to these changes in the load impedance to maintain the match between the combined load impedance and the source impedance of the RF generator.

In an RF power system in general, any mismatch between the source impedance and the load impedance causes a reflection of the power directed to the load, reducing the efficiency of the power delivery and potentially damaging the RF generator or other components in the RF generator, the matching network, other components in the RF power system. Maintaining a close match between the combined load and the source RF generator is therefore desirable in commercial plasma generating systems, which are expected to perform extremely precise and repeatable plasma manufacturing operations at micron scales over long operating lives.

In the representative plasma processing system 200, the RF generator 202 (source) supplies power to a combined load 230 including the T-coil assembly 210, the impedance matching network 220, and the plasma chamber 204 (load). To match the impedance of the combined load 230 with the impedance of the source RF generator 202, the impedance matching network 220 includes a module 222 that resonates an amount of the total capacitive reactance created by the plasma chamber load and 224 and this module 222 is electrically connected in series between the RF generator 202 and the plasma chamber 204. To allow continual fine adjustment of the match impedance, the impedance matching network includes one or more adjustable tunable capacitors electrically connected in shunt between the RF generator (source) and the plasma chamber (load). In this particular example, the impedance matching network 220 includes the first variable (tuning) capacitor 224 and the second variable (loading) capacitor 226 to finely adjust the impedance of the impedance matching network to drive the impedance mismatch (i.e., the control system error) between the RF generator 202 and the combined load 230 toward zero. Therefore, for clarity, capacitor 224 is serially connected, capacitor 226 is connected in shunt, capacitor 217 is connected in shunt, and capacitor 216 is connected in shunt In the representative plasma processing system 200, a controller 232 controls the variable capacitors 216 and 217 of the T-coil assembly 210, as well as the variable capacitors 224 and 226 of the impedance matching network 220 to drive the impedance mismatch (i.e., the control system error) between the RF generator 202 and the combined load 230 toward zero. In addition, the variable capacitors 224 and 226 of the impedance matching network 220 are typically electro-mechanical motor driven variable capacitors with response times on the order of milliseconds, while the variable capacitors 216 and 217 of the T-coil assembly 210 may be solid state variable capacitors with response times on the order of microsecond, lending to response times on the order of tens to thousands times faster for the T-coil assembly variable capacitors.

Figure 10:
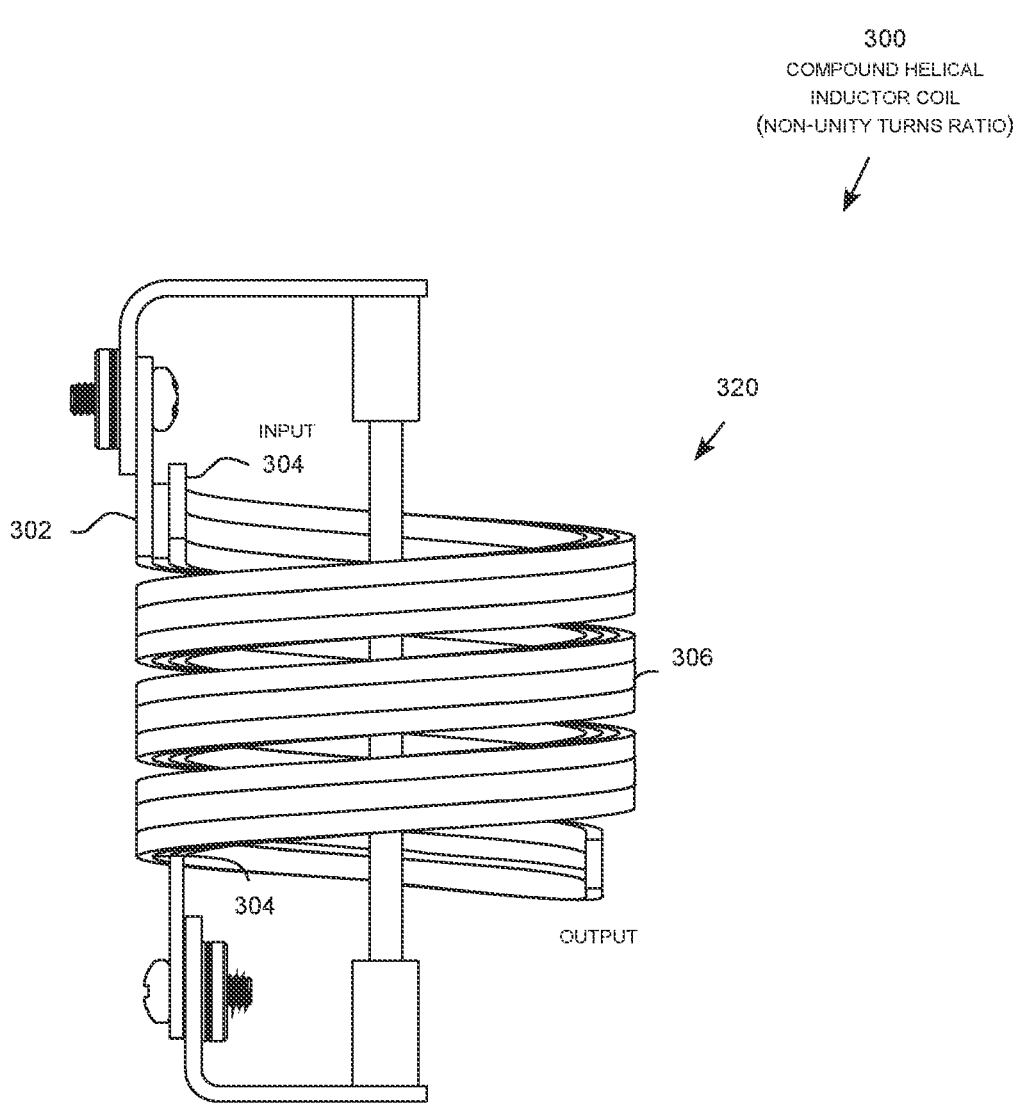
FIG. 10 is a side view of an alternative compound helical inductor coil with a non-unity turns ratio.
Figure 11:
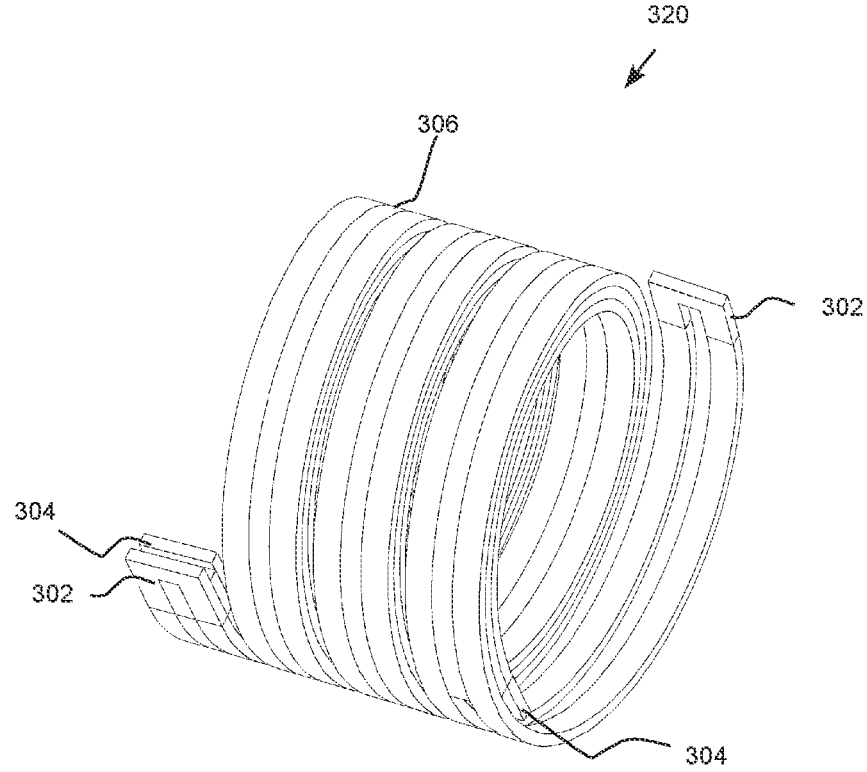
FIG. 11 is a perspective view of a compound helical coil for the helical inductor coil with a non-unity turns ratio.

FIG. 10 is a side view of an alternative compound helical inductor coil 300 with a non-unity turns ratio. In this example, the helical coil 320 includes an outer (primary) coil 302 that is longer than the inner (secondary) coil 304 and the insulator separator 306, resulting in a turns ratio between the inner (secondary) and outer (primary) coils 304, 302. In this the outer (primary) coil 302 extends 3.5 turns, while the inner (secondary) coil 304 extends three turns, resulting in a turns ratio of 3.5:3. FIG. 11 is a perspective view of the helical coil 320 for the helical inductor coil with a non-unity turns ratio.

Typical cylindrical single layer coils may have a number of issues and limitations in use. For example, typical cylindrical single layer coils may have a reduced Q factor when the length is greater than the diameter. Additionally, such coils have experienced poor cooling due to trapped air adjacent to the cylinder coil form when wound on a dielectric cylinder. Thus, when the coil length is greater than the radius, the coil has a greater equivalent series resistance and therefore a lower Q. However, coils with a radius much larger than the length generate fields with long return paths leading to increased eddy current generation in nearby conductors, therefore also lowering Q. The optimal radius to length ratio is typically about 1:1 for maximum Q. Typical coils may also have lower inductance per unit length of wire that may result in lower Q values. Such coils may also have less predictable manufacturing tolerances.

Embodiments of the present disclosure may decrease losses in voltage and current at high power, which results in better Q values due to better stored to dissipated energy ratios. Embodiments of the present disclosure may also advantageously maximize inductance per unit length of wire used, thereby resulting in better Q values. Such embodiments may further reduce distributed voltage across coils thereby reducing voltage stress potentials internally. Embodiments may further reduce magnetic field coupling to aluminum shield housing by optimizing magnetic field return paths, thereby reducing coupled eddy losses to the shield. Embodiments may also increase airflow around the inductor wire to improve cooling. Other advantages may include a mechanical form that provides predictable wire dimensional spacing in X, Y, and Z directions resulting in tighter manufacturing tolerance spread. Not all embodiments will exhibit all these characteristics and, to the extent that they exhibit more than one, they may not do so to the same extent.

Figure 12:
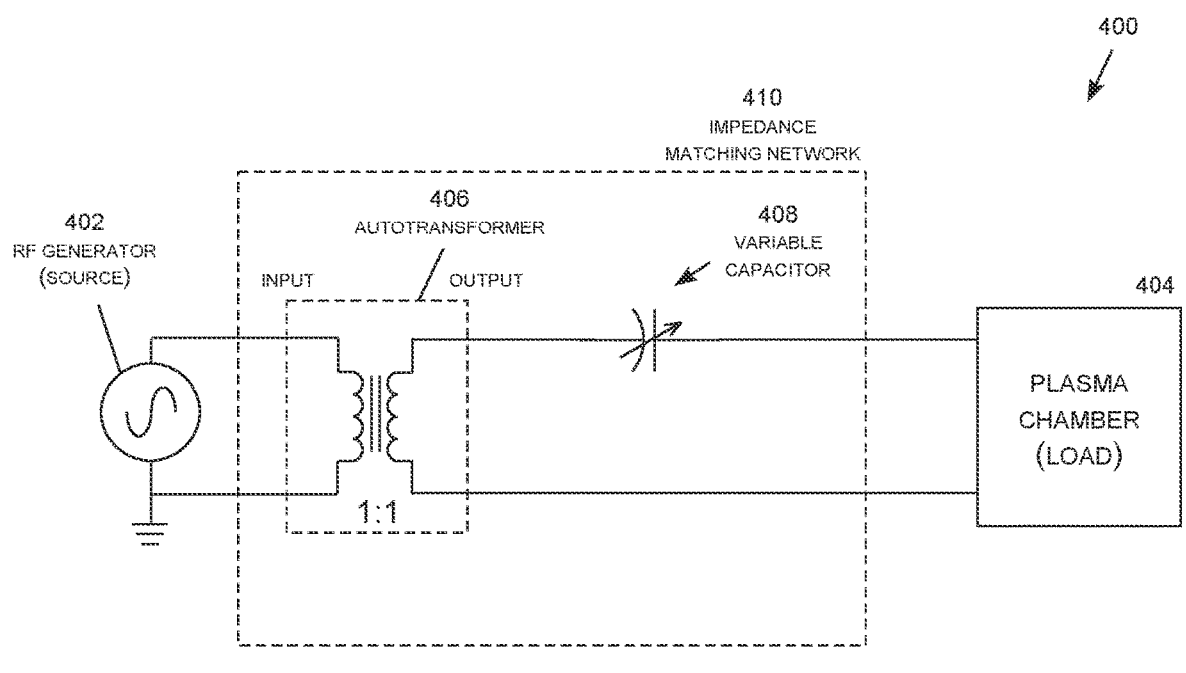
FIG. 12 is a schematic electric diagram of an alternative plasma processing system utilizing a compound helical inductor coil as an autotransformer.

FIG. 12 is a schematic electric diagram of an alternative plasma processing system 400 utilizing a compound helical inductor coil 406 or a single coil autotransformer. The input of the autotransformer 406 is coupled to the RF generator 402 (source), while the output of the autotransformer is coupled to a variable capacitor 408, which is connected in series to the plasma chamber 404 (load). In this example, the compound helical inductor coil 406 and the variable capacitor 408 form an impedance matching network 410 automatically controlled to drive an impedance mismatch between the RF generator 401 and the input of the autotransformer 408 toward zero. As known in this field of technology, other components, such as a series phase-shift inductor, a shunt variable capacitor, etc. may be added to the impedance matching network 410. Similarly, other components may be included in the plasma processing system 400 between the RF generator 402 (source) and the plasma chamber 404 (load), such as a filter, an arc suppression network, a solid state impedance matching network, etc.

Figure 13:
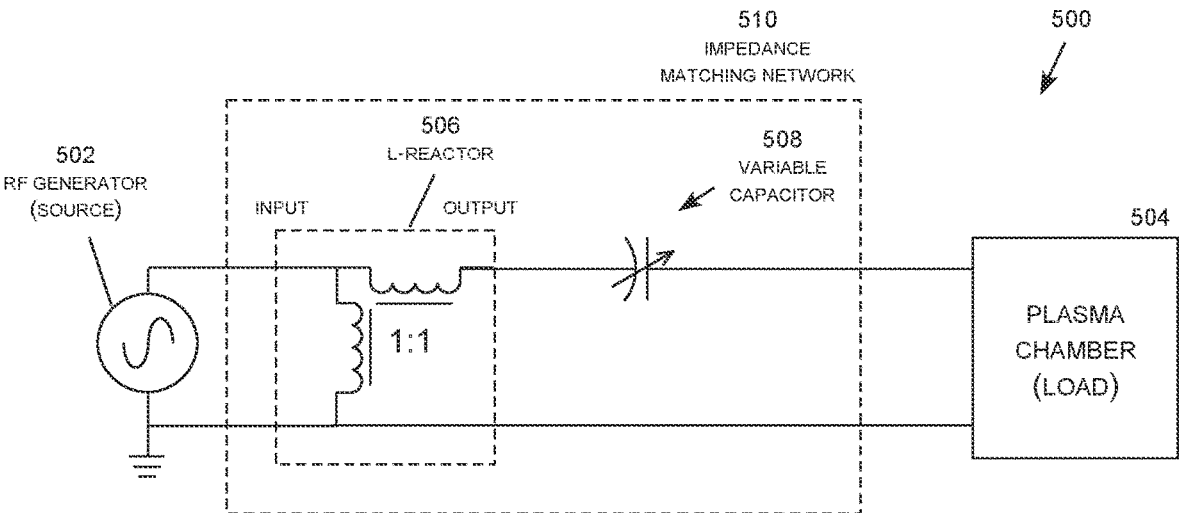
FIG. 13 is a schematic electric diagram of an alternative plasma processing system utilizing a compound helical inductor coil as an L-reactor.

FIG. 13 is a schematic electric diagram of an alternative plasma processing system 500 utilizing a compound helical inductor coil 506 as an autotransformer or L-reactor. The input of the compound helical inductor coil 506 is coupled to the RF generator 502 (source), while the output of the L-reactor is coupled to a variable capacitor 508, which is connected in series to the plasma chamber 504 (load). In this example, the compound helical inductor coil 506 and the variable capacitor 508 form an impedance matching network 510 automatically controlled to drive an impedance mismatch between the RF generator 501 and the input of the variable capacitor 508 toward zero. As known in this field of technology, other components, such as a series phase-shift inductor, a shunt variable capacitor, etc. may be added to the impedance matching network 510. Similarly, other components may be included in the plasma processing system 400 between the RF generator 502 (source) and the plasma chamber 504 (load), such as a filter, an arc suppression network, a solid state impedance matching network, etc.

It is emphasized that, in accordance with the standard practice in the industry, various features are not drawn to scale. In fact, the dimensions of the various features may be arbitrarily increased or reduced for clarity of discussion or illustration.

The foregoing description, for purposes of explanation, uses specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. Examples herein are not intended to be exhaustive of or to limit this disclosure to the precise forms described. Many modifications and variations are possible in view of the above teachings.

The examples herein are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A compound helical inductor coil, comprising:
a primary coil configured as a helix;
a secondary coil configured as a helix parallel with the primary coil; and
a dielectric insulator configured as a helix disposed between and separating the primary coil and the secondary coil, wherein
the primary coil has an elongate cut-out through which an outer protrusion of the dielectric insulator extends; and
the secondary coil has an elongate cut-out therein, through which an inner protrusion of the dielectric insulator extends.

2. The compound helical inductor coil of claim 1, further comprising:
a center conductor extending axially through a central helical axis of the primary and secondary coils, the center conductor coupled at a first end to the primary coil and coupled at a second end to the secondary coil.

3. The compound helical inductor coil of claim 1, wherein the primary and secondary coils are made of copper.

4. The compound helical inductor coil of claim 1, wherein the dielectric insulator is made of polytetrafluoroethylene (PTFE).

5. The compound helical inductor coil of claim 1, wherein primary coil and secondary coil define a unity turns ratio.

6. The compound helical inductor coil of claim 1, wherein primary coil and secondary coil define a non-unity turns ratio.

7. A T-coil assembly comprising:
a compound helical inductor coil according to claim 1,
a first shunt variable capacitor coupling a junction between an input of the primary coil to electric ground; and
a second shunt variable capacitor coupling a junction between an output of the primary coil and an input of the secondary coil to electric ground.

8. The T-coil assembly of claim 7, wherein:
the primary coil has an elongate cut-out through which an outer protrusion of the dielectric insulator extends; and the secondary coil has an elongate cut-out therein, through which an inner protrusion of the dielectric insulator extends.

9. The T-Coil assembly of claim 7, further comprising:
a center conductor extending axially through a central helical axis of the primary and secondary coils, the center conductor coupled at a first end to the primary coil and coupled at a second end of the secondary coil.

10. The T-Coil assembly of claim 7, wherein the primary and secondary coils are made of copper.

11. The T-Coil assembly of claim 7, wherein the dielectric insulator is made of (PTFE).

12. The T-coil assembly of claim 7, wherein primary coil and secondary coil define a unity turns ratio.

13. The T-coil assembly of claim 7, wherein primary coil and secondary coil define a non-unity turns ratio.

14. A plasma processing system comprising:
an RF generator supplying radio frequency power to a plasma chamber;
an impedance matching network coupled to the RF generator and the plasma chamber; and
a T-Coil assembly according to claim 9 coupled to the impedance matching network.

15. The plasma processing system of claim 14, wherein:
the primary coil has an elongate cut-out through which an outer protrusion of the dielectric insulator extends; and
the secondary coil has an elongate cut-out therein, through which an inner protrusion of the dielectric insulator extends.

16. The plasma processing system of claim 14, further comprising:
a center conductor extending through a central helical axial of the primary and secondary coils, the center conductor coupled at a first end to the primary coil and coupled at a second end to the secondary coil.

17. The plasma processing system of claim 14, wherein the primary and secondary coils are made of copper and the dielectric insulator is made of (PTFE).

18. The plasma processing system of claim 14, wherein primary coil and secondary coil define a unity turns ratio.

19. The plasma processing system of claim 14, wherein primary coil and secondary coil define a non-unity turns ratio.

* * * * *